United States Patent [19]

Mayes

[11] Patent Number: 5,297,066

[45] Date of Patent: Mar. 22, 1994

[54] DIGITAL CIRCUIT SIMULATION OF ANALOG/DIGITAL CIRCUITS

[75] Inventor: Michael K. Mayes, Sunnyvale, Calif.

[73] Assignee: National Semiconductor Corporation, Santa Clara, Calif.

[21] Appl. No.: 780,775

[22] Filed: Oct. 22, 1991

[51] Int. Cl.$^5$ .............................................. G06G 7/48
[52] U.S. Cl. ...................................... 364/578; 364/488; 364/489; 364/490; 371/23; 371/22.3
[58] Field of Search ............... 364/578, 488, 489, 490; 371/23, 22.3

[56] References Cited

U.S. PATENT DOCUMENTS 5,084,824  1/1992  Lam et al. ............................ 364/490
5,105,373  4/1992  Rumsey et al. ...................... 364/578

Primary Examiner—Jack B. Harvey
Assistant Examiner—Kamini Shah
Attorney, Agent, or Firm—Flehr, Hohbach, Test, Albritton & Herbert

[57] ABSTRACT

A method and apparatus for providing a single digital simulation of a circuit with analog and digital components. A netlist characterizing a circuit with analog and digital components is utilized. The netlist defines each component in the circuit and its interconnections. The netlist is conveyed to a digital simulator which includes an expanded cell library. The cell library defines analog components in a digital manner. The digitally defined analog components process analog signals which are simulated as arrays of binary values, termed vector voltages. The vector voltages may be combined, mathematically or logically, with other vector voltages to produce binary signals suitable as inputs to digital circuit elements. Regardless of the complexity of the circuit, and despite the fact that both analog and digital components are present, a single integrated digital simulation of the entire circuit is rapidly executed by utilizing digital models of the analog components.

13 Claims, 5 Drawing Sheets

| reg\time | b | a | Rvin | Rv_msb | Rvdac |
|---|---|---|---|---|---|
| t1 ⌐ | ▨ | vin | a | ▨ | ▨ |
| t2 ⌐ | vin−v_msb | v_msb | hold | a | ▨ |
| t3 ⌐ | vin−vdac | vdac | hold | hold | a |

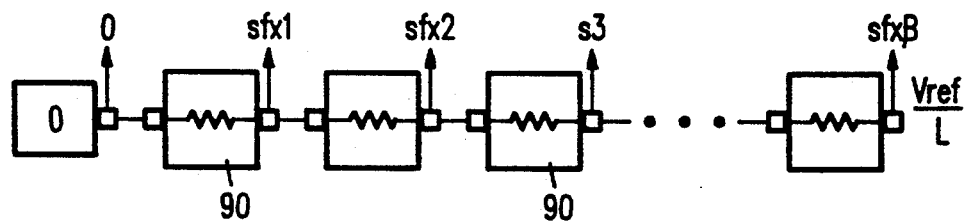
FIG. 7
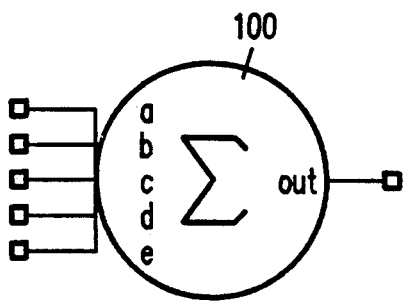
FIG. 8
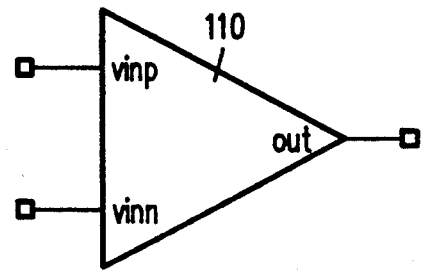
FIG. 9
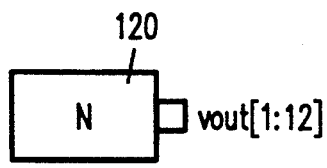
FIG. 10
| N | vout[1:12] | ADC equivalent output |
|---|---|---|
| 1 | 4 | 1LSB = 1.22mv |
| 2 | 8 | 2LSB = 2.44mv |
| 3 | 12 | 3LSB = 3.66mv |
| 4 | 16 | 4LSB = 4.88mv |
| 5 | 20 | 5LSB = 6.10mv |
| 6 | 24 | 6LSB = 7.32mv |
| ... | ... | ... |
| 14 | 56 | 14LSB = 17.1mv |
| 15 | 60 | 15LSB = 18.31mv |
| 16 | 64 | 16LSB = 19.53mv |
FIG. 11

DIGITAL CIRCUIT SIMULATION OF ANALOG/DIGITAL CIRCUITS

BRIEF DESCRIPTION OF THE INVENTION

This invention relates generally to devices which simulate the operation of circuits. More particularly, this invention relates to a method and apparatus for providing a digital simulation for a circuit which includes both analog and digital elements.

BACKGROUND OF THE INVENTION

Electronic devices commonly include analog and digital elements. As a result, an analog-to-digital converter (ADC) is used to provide an interface between the two types of signals. Typical analog-to-digital converters include resistor ladders, capacitor arrays, sampled-data comparators, and analog multiplexers, as well as a variety of digital circuits. The digital and analog circuit elements may interact in many different ways. For instance, the digital circuitry may strobe comparators and drive analog multiplexers for routing of analog voltage levels. The analog elements often generate signals interfacing to the digital circuitry. Partitioning the analog and digital domains is difficult because of the existence of feedback signals between the two domains. Analog-to-digital converter architectures continue to grow in complexity as multiple steps and trimming algorithms are employed to obtain higher resolutions. Prior to physical implementation, these and other complex circuit designs are typically tested through a computerized simulation. Simulating a circuit with analog and digital components generally requires separate simulations of the analog and digital blocks.

There are a number of problems with this approach. Primarily, this approach does not detect errors at the interface between the two domains. This interface region of the circuit is susceptible to a number of problems. For instance, resistor tap-points may be off center, decoder or encoder values may be incorrect, capacitor ratios may be mismatched, or the availability of memory addresses may be mismatched with an address strobe. These problems, and others, are often encountered, but they are not detectable by using separate conventional digital and analog simulations.

In addition to the problem of detecting errors at the domain interface, prior art circuit simulation techniques are unsatisfactory to the extent that they rely upon analog simulations. Analog simulations are commonly run on simulators such as SPICE. These simulators are relatively slow. In contrast, digital simulators such as Verilog or Hilo are relatively fast.

Another difficulty associated with running separate simulations for the analog and digital components of a circuit is that the separate simulations do not account for feedback signals which may exist between the two blocks.

Mixed signal simulation design tools presently exist. However, these tools are complex and have not resulted in practical design verification tools.

OBJECTS AND SUMMARY OF THE INVENTION

Thus, it is a general object of the present invention to provide a single circuit simulator for both the analog and digital components of a circuit.

It is a related object of the present invention to provide a circuit simulator which is capable of detecting errors at the interface between digital and analog domains.

It is another object of the present invention to provide a circuit simulator which simulates both the analog and digital components of a circuit in a digital format.

It is a related object of the present invention to provide a fast mixed signal circuit simulator.

It is another object of the present invention to provide a circuit simulator which accounts for feedback signals between analog and digital domains.

These and other objects are achieved by a method and apparatus for providing a single digital simulation of a circuit with analog and digital components. A netlist characterizing a circuit with analog and digital components is utilized. The netlist defines each component in the circuit and its interconnections. The netlist is conveyed to a digital simulator which includes an expanded cell library. The cell library defines analog components in a digital manner. The digitally defined analog components process analog signals which are simulated as arrays of binary values, termed vector-voltages. The vector-voltages may be combined, mathematically or logically, with other vector-voltages to produce binary signals suitable as inputs to the digitally modeled analog circuit elements. In addition, vector-voltages can be converted, using circuit elements such as comparators, into digital logic signals suitable as inputs to digital circuit elements. Regardless of the complexity of the circuit, and despite the fact that both analog and digital components are present, a single integrated digital simulation of the entire circuit is rapidly executed by utilizing digital models of the analog components.

BRIEF DESCRIPTION OF THE DRAWINGS

For a better understanding of the nature and objects of the invention, reference is made to the following detailed description taken in conjunction with the accompanying drawings, in which:

FIG. 7 is a depiction of a resistor ladder utilized in accordance with the present invention.

FIG. 8 is a depiction of a summation element utilized in accordance with the present invention.

FIG. 9 is a depiction of a comparator utilized in accordance with the present invention.

FIG. 10 is a depiction of a voltage source utilized in accordance with the present invention.

FIG. 11 is a table depicting appropriate analog to digital conversion values for a digital voltage source.

Like reference numerals refer to corresponding parts throughout the several views of the drawings.

DETAILED DESCRIPTION OF THE INVENTION

Figure 1:
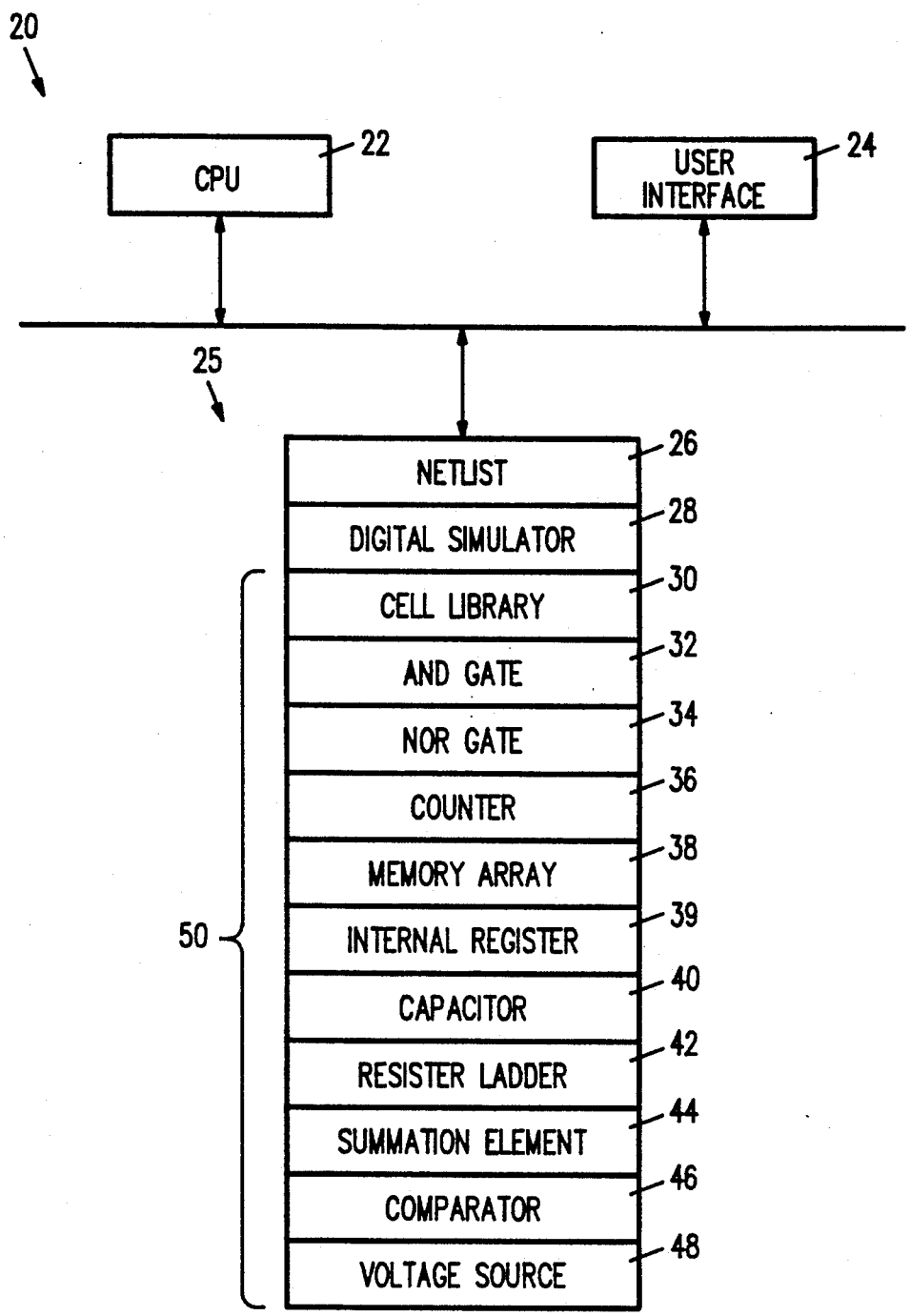
FIG. 1 is a block diagram of a general purpose computer which may used in accordance with the present invention.

Referring to FIG. 1, a general purpose computer 20 which may be used in accordance with the present invention is depicted. The computer 20 includes a CPU 22 which is coupled to user interface 24; the user interface 24 includes a keyboard, mouse, monitor, and printer. Memory 25 is coupled to CPU 22 and user interface 24; memory 25 may be any combination of disk memory, RAM, and ROM.

A netlist 26 is stored within memory 25. As is known in the art, a netlist comprises a list of physical circuit components and the interconnections between those components. Thus, the netlist 26 defines the interconnections between all functional elements in a physical circuit. By simulating the operation of the physical circuit represented by the netlist, the entire physical circuit can be tested for proper operation prior to fabrication.

A digital simulator 28 is provided for this purpose. A number of commercially available digital simulators are known in the art, including Verilog and Hilo. For purposes of illustration, the present invention is disclosed in relation to a Verilog simulator and its corresponding syntax, however, as will be appreciated by one skilled in the art, the teachings of the invention are equally applicable to other digital simulators.

The digital simulator 28 includes a cell library 30. The cell library 30 stores the attributes corresponding to the function of the individual physical circuit components. Thus, by way of example, a typical digital simulator includes attribute information for an AND gate 32, a NOR gate 34, a counter 36, and a memory array 38. The AND gate cell 32 represents a physical circuit element having the following attributes: it generates an output of ONE if its two inputs are ONE, otherwise its output is ZERO. The NOR gate cell 34 represents a physical circuit element which generates an output of ONE if its two inputs are ZERO, otherwise its output is ZERO. The counter cell 36 represents a physical circuit element which keeps track of the number of pulses applied to it. The output of the counter 36 is a binary array of numbers, for instance a 16 bit array. This array can then be utilized directly by the circuit or converted to a decimal format for output for analysis by an operator of the digital simulator 28. Digital simulator 28 also includes a memory array cell 38 which outputs a binary array of numbers.

Digital simulator 28 uses a full cell library 30 to model all physical digital components within a digital circuit. As is known in the art, digital simulators are capable of providing a complete simulation of a proposed circuit, as defined by the netlist, in a relatively short period of time. This time advantage stands in contrast to the time-consuming process of providing an analog simulation of a circuit.

In accordance with the present invention, the cell library 30 of digital simulator 28 is expanded to include models for analog circuit elements. Thus, the digital simulator 28 of the present invention is not limited to digital components, but is expanded to include analog elements as well. Digital modeling of analog circuit components results in a number of benefits. First, a rapid simulation of a physical circuit with analog elements is achieved. Next, the digital modeling of physical analog circuit elements obviates the necessity of running two separate simulations, one for the analog components of the circuit and one for the digital components of the circuit. In addition, the single digital simulation allows a unified analysis of the interaction between the digital and analog physical elements, including the effect of feedback between the separate domains.

In accordance with the present invention, digital models are provided for a number of physical analog components. Models for a capacitor 40, a resistor ladder 42, a summation element 44, a comparator 46, and an analog voltage source 48 are provided herein.

Figure 2:
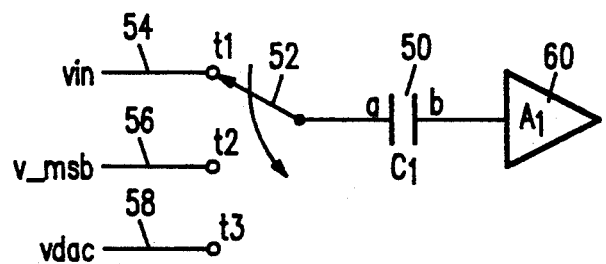
FIG. 2 is a depiction of an analog capacitor coupled to a gate which switches the capacitor to a number of voltage sources.
Figure 3:
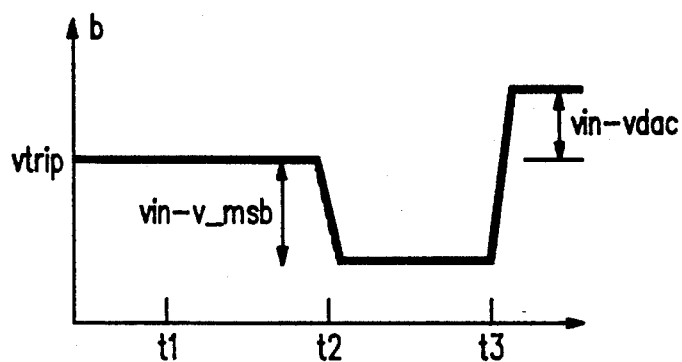
FIG. 3 is a graph of voltage as a function of time for the capacitor of FIG. 2.

A digital capacitor model in accordance with the present invention is disclosed in relation to FIGS. 2–5. Turning to FIG. 2, an analog capacitor 50 is depicted. The analog capacitor 50 is coupled to a switch 52 which may be moved to a number of voltage sources including Vin 54, v_msb 56, and vdac 58. The output of the analog capacitor 50 is shown herein as being coupled to a comparator 60.

Analog capacitors 50 are used in actual analog-to-digital converters to sample-and-hold analog input voltages and subtract algorithmically generated voltage levels from initially acquired voltages. The operation of such a capacitor 50 is depicted in relation to FIG. 3. At time t1 the comparator 60 is biased to its trip point Vtrip and "node a" of capacitor 50 is tied to Vin 54. Time t1 is known as the auto zero and acquisition time. During this phase, the comparator 60 output at "node b" is shorted to its input in order to bias the comparator. The trip point is unobservable by the digital circuitry; therefore, Vtrip is assigned a zero value. The sampling of the input voltage and subsequent switching operations determine the comparator output; consequently, it is necessary to model the charge redistributive properties of the capacitor 50.

At time t2, the capacitor 50 is switched to voltage v_msb 56. In this example, v_msb is a value derived from a resistor ladder, which is not shown in this figure. The net voltage change at node b of capacitor 50 is Vin-V_msb. If Vin>V_msb, the voltage change at node b is positive leading to a "1" output from the comparator 60. If Vin<V_msb, the net result is negative leading to a comparator output of "0". Similarly, at time t3 the voltage at node b becomes Vin-Vdac, where Vdac is derived from another resistor ladder, which is not shown in this figure.

The analog functionality of physical capacitor 50 may be digitally modeled in accordance with the present invention. In particular, the storage capability of a capacitor is modeled through the use of vector-voltage registers 39. The vector-voltage registers 39 are memory locations used by the simulator to store signal values. As in all simulators, registers are used to store all node voltages, as well as internal model values associated with each simulated circuit component. The vector-voltage registers 39 used for each capacitor element are analogous to the binary arrays associated with counter 36 and memory array 38.

In accordance with the present invention, analog voltages are represented in simulators such as Verilog by a vector of binary values, called a vector-voltage herein. This is accomplished by replacing all analog paths with N-bit busses, where N defines the resolution of the analog voltage. Thus, in a 15 bit system, allowing 1 bit for polarity, N=15. If a 5 V system is being utilized, 0.31 mv resolution is possible. This modeling is depicted in relation to FIG. 6.

In a preferred embodiment, all analog voltage signal paths are 15-bit vector busses representing a dynamic range of +/−5 V. In order to allow negative voltages, a sign bit is required since Verilog does not accept negative numbers. Therefore, when the vector-voltage is greater than 16,384, it is positive; conversely, vector-voltages less than 16,384 are negative. The vector-voltage representation of an analog signal is treated by Verilog either as an array of separate binary values or as an integer which may be manipulated in Verilog by addition, subtraction, multiplication, division, and equality. In other words, Verilog is already capable of performing mathematical operations on vectors of binary values. The present invention uses this vector handling capability to simulate analog signal processing.

Figure 4:
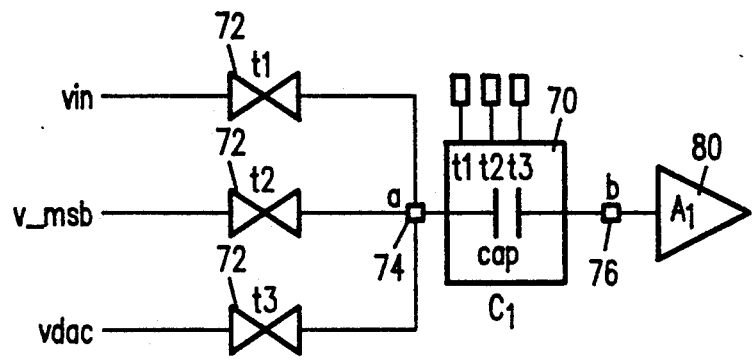
FIG. 4 is a depiction of a digital capacitor modeled in accordance with the present invention.

Turning to FIG. 4, a digital capacitor model 70 in is depicted. The capacitor output is dependent upon changes in the applied input vector-voltages. In order to sense a change in the input voltage, synchronizing input signals are applied to the capacitor module to tell the capacitor when a new input voltage is present. Changes in t1, t2, and t3 strobe the subtraction of the capacitor. The input of the capacitor "node a" 74 at time t1 is stored in a register Rvin, at time t2 it is stored in register Rv_msb, and at time t3 it is stored in Rvdac. An offset of 16384 is added to set the positive sign bit, as described above.

The input of the capacitor "node a" 74 is tied to transmission gates 72. The transmission gates 72 are represented by simple modules which pass the input vector-voltages Vin, V_msb, and vdac when t1, t2, and t3 are respectively high. Otherwise, they are in a high impedance state.

Figures 5, 6:
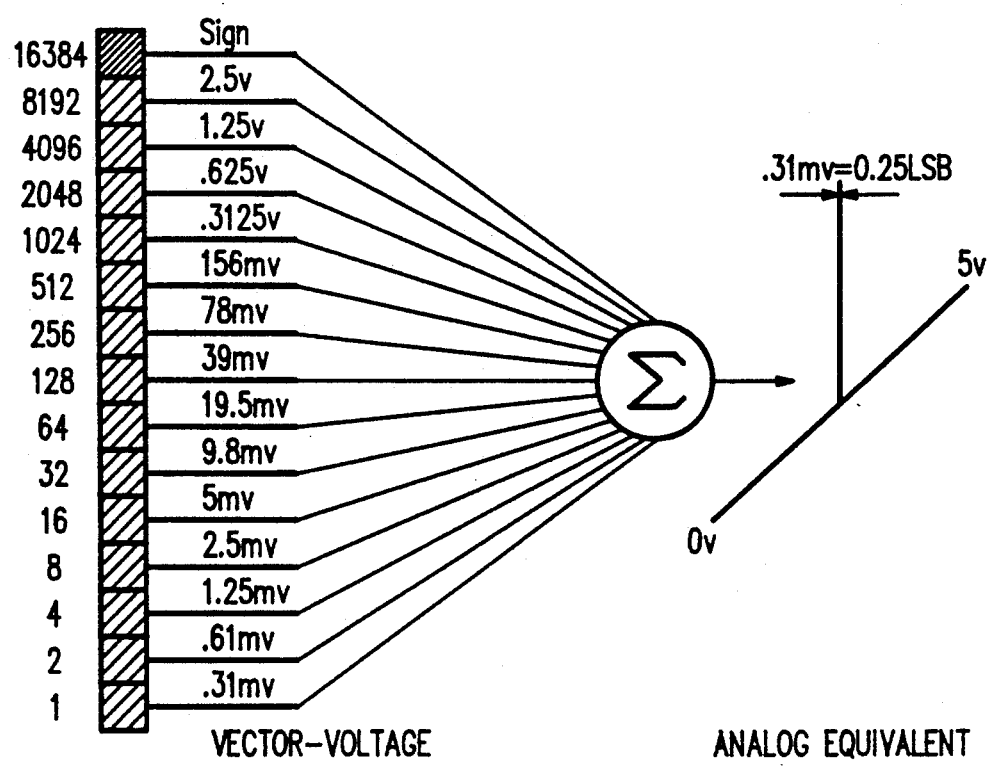
FIG. 5 is a table reflecting the various outputs of the digital capacitor of FIG. 4.
FIG. 6 is an analog voltage to digital voltage conversion model which may be used in accordance with a 16 bit embodiment of the present invention.

FIG. 5 discloses the state table associated with digital capacitor 70. While t1 is high, a vector-voltage representation of Vin is multiplexed to "node a" 74. When clocking signal t1 goes low, register Rvin is set equal to the vector-voltage at "node a", in this case Vin. When t2 goes high, Vin is isolated from "node a" and v_msb is multiplexed to "node a". Verilog register Rv_msb is set equal to "node a" 74 vector-voltage. The input to the digital comparator 80 "node b" 76 is set equal to:

V("node b")=Rvin-Rv_msb+16384

The digitally modeled comparator 80, which will be further discussed below, outputs a digital "1" if V("node b")>0 and a "0" if V("node b")<=0. The zero ("0") denoted in the previous sentence is actually a zero equivalent; that is, the most significant bit is set and an actual digital value of 16,384 is present, which corresponds to zero in the embodiment described herein. Similarly, at time t3 capacitor register Rvdac is set equal to the multiplexed voltage Vdac. The comparator input becomes:

V("node b")=Rvin−Rvdac+16384

Verilog code suitable for executing these functions is as follows:

```
module cap2_v(a,b,t1,t2,t3)
    output[1:15]b;
    input[1:15]a;
```

```
    input t1,t2,t3;
    reg[1:15] b,Rv_msb,Rvin,Rvdac;
initial
    b=15'b16384;
always @(negedge t1)
    begin
        #5 Rvin=1*a + 16384;
    end
always @(posedge t2)
    begin
        #50 Rv_msb=1*64*a;
        #2 b=Rvin-Rv_msb;
    end
always @(posedge t3)
    begin
        #50 Rvdac=1*64*a;
        #2 b= Rvin-Rvdac;
    end
endmodule
```

The foregoing code initially defines "node a" 74 as a 15 bit input array and "node b" 76 as a 15 bit output array suitable for receiving vector-voltage values. Registers Rvin, Rv_msb, and Rvdac are also defined as 15 bit arrays. "Node b" is then initialized by adding 16,384 to set the positive bit.

Three loops are then entered, one for each of the inputs t1, t2, and t3. At the t1 input Rvin becomes the value of "node a" plus 16,384. In this example, "node a" is multiplied by 1 because one capacitor is utilized before the comparator 80, if 2 capacitors were utilized, then "node a" would be multiplied by 2 and so forth. At the t2 input, Rv_msb becomes 64 times "node a". In this example 64 is multiplied by one because only one capacitor is present, if two capacitors are present, then 64 should be multiplied by 2 and so forth. Multiplication by 64 is undertaken for the purpose of scaling the vector-voltage value received from a resistor ladder (not shown). The "b node" is then assigned the value of Rvin-Rv_msb. Finally, at time t3, Rvdac receives the value of "node a" times 64 and "node b" receives the value of Rvin-Rvdac. The "#" notation represents a delay value to accommodate circuit signal propagation delay.

Another physical analog element modeled as a digital element in accordance with the present invention is the resistor ladder. In actual analog-to-digital converters, the resistor ladder is an important analog component used to divide the reference voltage into discrete voltage quantities for use in the conversion algorithm. An actual resistor ladder containing B resistors spanning from 0 to Vref divides Vref into B+1 equal voltage steps. These voltages monotonically increase from resistor tap point to resistor tap point in Vref/B steps. Each resistor in a resistor ladder may be modeled for simulation purposes using the following Verilog code:

```
module resistor(vout,vin);
    output[1:15]vout;
    input[1:15]vin;
    reg[1:15]vout;
    initial
        forever
            begin
                #1 vout=vin + sf;
            end
endmodule
```

In the module, inputs and outputs are defined as 15 bit registers for handling vector-voltages. The resistor output (Vout) is always the input plus a scale factor (sf). This scale factor is a vector-voltage equivalent to the voltage drop across the resistor. By stringing several Verilog resistors 90 together, a monotonically increasing ladder of vector-voltages is modeled, as can be appreciated in relation to FIG. 7.

The lower vector-voltage of the resistor ladder, which is the input to the first resistor, is fixed at 0 by a constant output vector source. The output of each resistor drives the input of the next. This results in an increase of the scale factor for each resistor output, resulting in an array of vector-voltages given by $$VV(sf) = \{1,2,3,4,5, \ldots, B\} * sf$$

Multiplication scale factors are used to convert this ladder of vector-voltages into levels of the appropriate magnitude, dependent upon the total voltage across the ladder Vref and the total length B. The scale factor is given by $$sf = 16384/(L * B)$$

where B is the number of resistors spanning the voltage range Vref/L and L is the fraction of the full scale range which the resistor ladder spans. Alternately, the scale factor can be set to a value of 1 and the resulting voltages can be scaled when input to other circuit components.

Other physical circuit elements which need a digital model include a summation element, a comparator, and a voltage source. A summation element 100 is depicted in relation to FIG. 8. The summation element 100 may be used to add capacitive vector-voltage values. Simple Verilog code to realize a summation element is as follows:

```
module sumnode_v(a,b,c,d,e,out);
    output[1:15]out;
    input[1:15]a,b,c,d,e;
    reg[1:15]out;
    initial
        forever
            begin
                #1 out=a+b+c+d+e;
            end
endmodule
```

The input and output values are defined as 15 bit arrays for handling vector-voltages. The output value is simply the sum of the input nodes, which typically has no more than 12 bit values.

Still another physical analog element which is modeled as a digital cell in accordance with the present invention is a comparator. A comparator 110 in accordance with the present invention is disclosed in relation to FIG. 9. An actual analog comparator is a circuit which determines the inequality of two analog voltages. For the ideal comparator, if Vinp > Vinn the output is ONE. Conversely, if Vinp < Vinn, the output is a ZERO.

The comparator is the final interface between the analog circuit elements and the digital circuit elements in an actual analog-to-digital circuit. An actual analog comparator may be modeled as a digital element in Verilog by using the following code:

```
module comparator_v(vinp,vinn,out);
```

-continued
```
    output out;
    input[1:15] vinp,vinn;
    reg out;
    initial
        begin
            if(vinp > vinn) #2 out=1;
                else #1 out=0;
        end
endmodule
```

This module compares its two input array values and assigns a binary output of ONE if Vinp is greater than Vinn, otherwise it assigns a binary value of ZERO.

Yet another analog physical element which is modeled as a digital element in accordance with the present invention is a voltage source. A digital voltage source 120 is depicted in FIG. 10. Suitable Verilog code for creating vector- voltages is as follows:

```
module v4(vout);
    output[1:15]vout;
    reg[1:15]vout;
    initial
        vout = 15'd4;
endmodule
```

This module corresponds to the analog-to-digital voltage conversion of N=4 in the table depicted in FIG. 11. In the preferred embodiment, 16 distinct voltage source models are provided, as listed in FIG. 11. The table of FIG. 11 provides a suitable analog-to-digital conversion scheme. Through these conversions, actual analog voltage values are converted to vector-voltages for use in the simulation of the actual circuit.

Figure 12:
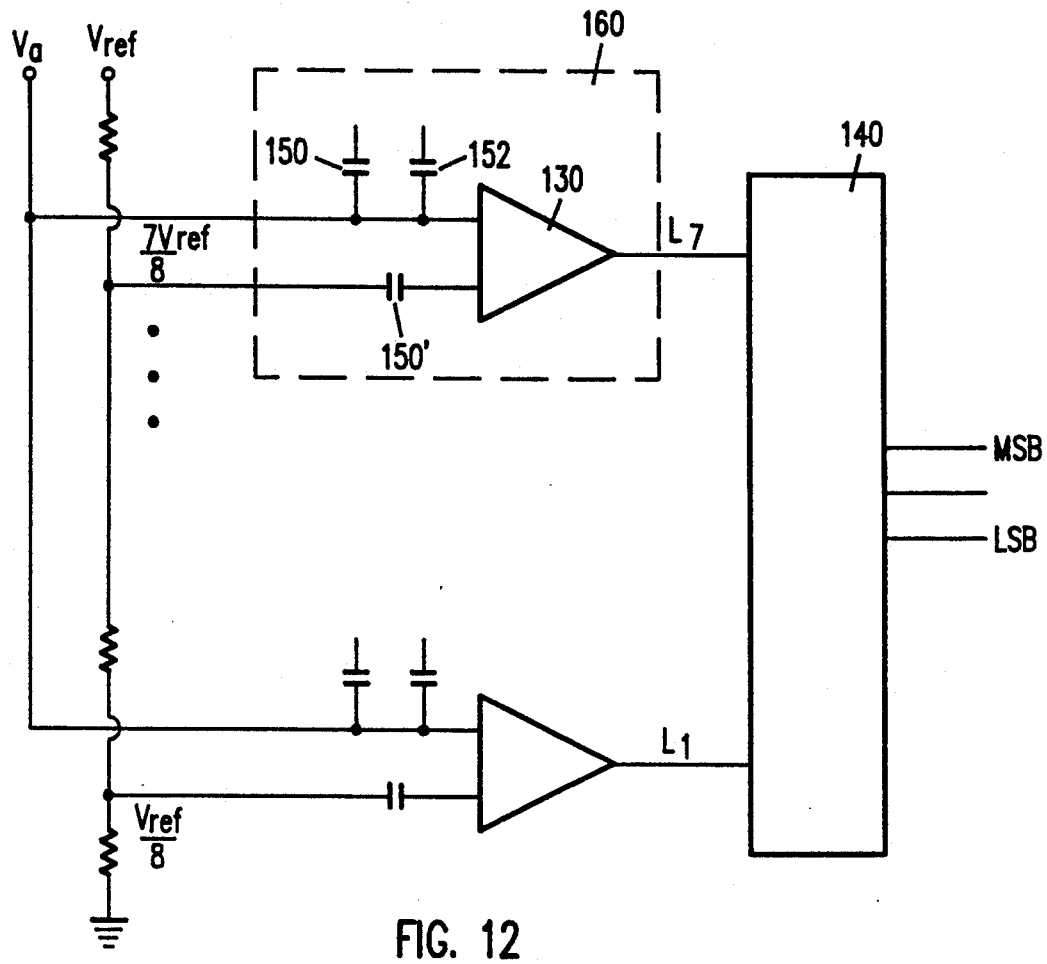
FIG. 12 is a schematic of a 3-bit parallel A/D converter.

Turning now to FIG. 12, an actual 3-bit parallel ADC is depicted. The analog input Va is estimated by the thresholds of seven adjacent analog comparators 130. The output is low (ZERO) for all analog comparators 130 with thresholds above the analog input voltage Va and high (ONE) for each comparator whose threshold is below the analog voltage input Va. An encoder 140 converts the input pattern into a 3 bit digital value which corresponds to the analog voltage value.

Capacitors 150 may also be utilized to sample-and-hold the analog input voltages and subtract generated voltage levels from the initial acquired voltage. A trimming capacitor 152 may also be provided.

The ADC of FIG. 12 is a simple embodiment for the purposes of illustration. Present ADCs typically include digital circuits for controlling successive passes by the analog circuits and obtain a much higher resolution than is possible from the exemplary ADC of FIG. 12.

Figure 13:
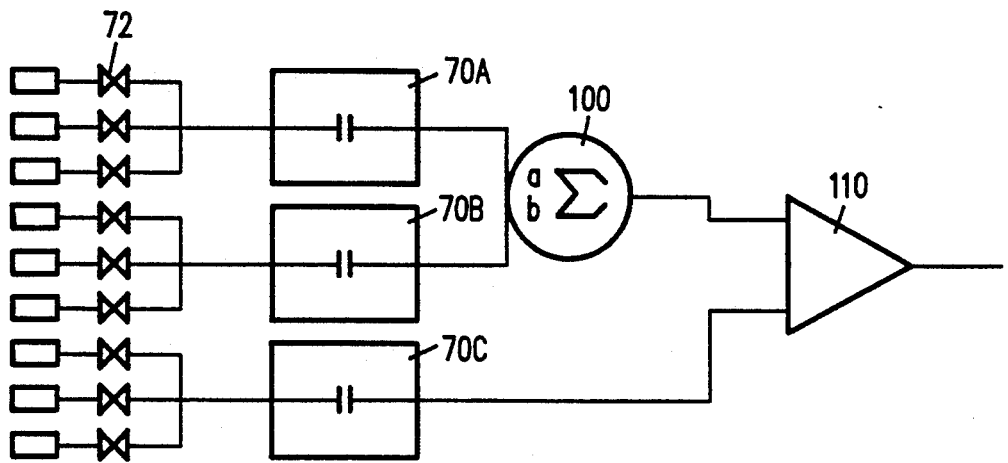
FIG. 13 is a representation, in accordance with the present invention, of a portion of the A/D converter of FIG. 12.

In any event, FIG. 13 illustrates a portion 160 of the ADC of FIG. 12. More particularly, FIG. 13 depicts a digital model of the actual analog elements of an analog-to-digital converter. The actual analog comparator is replaced with the digitally modeled comparator 110. The actual analog capacitor 150 and analog trimming capacitor 152 are replaced with digitally modeled capacitors 70A and 70B. To achieve the summing of the vector-voltages of these capacitive components, summation element 100 is provided. The other input to digitally modeled comparator 110 is digitally modeled capacitor 70C. Transmission gates 72 drive each of the capacitors 70A, 70B, and 70C.

Thus, the digital simulator 28 of the present invention includes an expanded cell library 30 to accommodate digital equivalents of analog elements. This digital modeling relies upon vector-voltage representations of analog voltage values. As a result of this modeling, the netlist 26 fed to the digital simulator may include analog elements and the entire simulation may be run in a digital simulation environment. Regardless of the complexity of the circuit, and despite the fact that both analog and digital components are present, a single integrated simulation of the entire circuit is rapidly executed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A method of digitally simulating the operation of an electronic circuit having both analog and digital components, said method comprising the steps of:
   storing in a memory module of a data processor a netlist representing a specified electronic circuit, said netlist containing a list of analog and digital circuit components and corresponding connections for each of said components;
   retrieving from a cell library stored in said memory module of said data processor, digital circuit models for each of said analog and digital circuit components in said netlist; and
   simulating the operation of said specified electronic circuit on a digital circuit simulator that simulates said specified electronic circuit with said digital circuit models, said simulation step including representing each analog signal received and processed by said specified electronic circuit as a vector of binary signal values.

2. The method of claim 1 wherein at least one of said digital circuit models in said cell library represents an analog circuit component which receives at least one analog input signal represented as a vector of binary signal values and which outputs at least one separate binary signal suitable for use as an input signal to a digital circuit component.

3. The method of claim 1 wherein said representing step includes providing at least an 8 bit vector of binary signal values for each of said analog signals.

4. The method of claim 1 wherein said retrieving step includes supplying a digitally modeled capacitor, voltage source, and comparator.

5. The method of claim 1 wherein said retrieving step includes supplying a digitally modeled resistor ladder and summing element.

6. A method of digitally simulating on a digital circuit simulator the operation of an electronic circuit having both analog and digital components, said method comprising the steps of:
   storing in a memory module of a data processor a netlist representing a specified electronic circuit, said netlist containing a list of analog and digital circuit components and corresponding connections for each of said components;
   converting each of said analog and digital circuit components in said netlist to a corresponding digital circuit model comprising a set of specified mathematical relationships between binary input and binary output signals; and
   simulating the operation of said specified electronic circuit with said digital circuit models, said simulating step including representing analog input signals into said specified circuit and analog signals generated by said analog circuit components as a vector of binary signal values.

7. The method of claim 6 wherein said representing step includes providing at least a 8 bit vector of binary signal values for each of said analog signals.

8. The method of claim 7 wherein said converting step includes supplying a digitally modeled capacitor, voltage source, and comparator.

9. The method of claim 7 wherein said converting step includes supplying a digitally modeled resistor ladder and summing element.

10. The method of claim 8 wherein said digital capacitor includes three time inputs, t1, t2, and t3, the operation of said digital capacitor including the steps of subtracting a first voltage value from a Vinput value at time 2 and subtracting a second voltage value from said Vinput value at time 3.

11. An apparatus for simulating the operation of an actual circuit which includes digital and analog components, said apparatus comprising:
    means for storing a netlist defining an actual circuit including a plurality of digital and analog circuit components and their corresponding interconnections; and
    means for analyzing said netlist, said analyzing means including
       means for defining analog voltage values received and processed by said actual electronic circuit as vector-voltage values, and
       means for providing digital representations of said analog components, whereby said analyzing means provides a single digital simulation of the operation of an actual circuit with analog and digital components.

12. The apparatus of claim 11 wherein said analyzing means includes a digital simulator with an expanded cell library including modeled digital capacitors, digital resistors, digital comparators, digital voltage sources, and digital summation elements.

13. The apparatus of claim 12 wherein said analyzing means includes a CPU, a user interface coupled to said CPU, and memory means coupled to said CPU and said user interface, said memory means storing said netlist, said digital simulator, and said cell library.

* * * * *